US008376431B2

(12) United States Patent  (10) Patent No.: US 8,376,431 B2
Na et al. (45) Date of Patent: Feb. 19, 2013

(54) PICK-AND-PLACE MODULE FOR TEST HANDLER

(75) Inventors: Yun Sung Na, Cheunan (KR); Tae-Hung Ku, Suwon-si (KR); Cheul-Gyu Boo, Hwaseong Si (KR)

(73) Assignee: TechWing Co., Ltd., Hwaseung-si (KR)

( * ) Notice: Subject to any disclaimer, the term of this patent is extended or adjusted under 35 U.S.C. 154(b) by 134 days.

(21) Appl. No.: 12/788,200

(22) Filed: May 26, 2010

(65) Prior Publication Data

US 2010/0316478 A1 Dec. 16, 2010

(30) Foreign Application Priority Data

Jun. 11, 2009 (KR) .................. 10-2009-0051943
Mar. 26, 2010 (KR) .................. 10-2010-0027576

(51) Int. Cl.
A47B 97/00 (2006.01)
(52) U.S. Cl. ....................................................... 294/65
(58) Field of Classification Search ................ 294/64.1, 294/64.2, 65; 414/749.5, 752.1, 737; 901/40; 312/215, 222, 332.1; 220/326; 292/95, 121–122, 292/126, 100, 194, 219–220, 226, 200
See application file for complete search history.

(56) References Cited

U.S. PATENT DOCUMENTS

| | | | | |
|---|---|---|---|---|
| 5,290,134 A * | 3/1994 | Baba | ............................. | 414/404 |
| 5,943,842 A * | 8/1999 | de Koning et al. | .............. | 53/247 |
| 6,137,286 A * | 10/2000 | Ho et al. | .................. | 324/757.01 |
| 6,870,360 B2 * | 3/2005 | Hwang | .................... | 324/750.19 |
| 7,390,040 B2 * | 6/2008 | Subotincic | ...................... | 294/65 |
| 2002/0153735 A1 * | 10/2002 | Kress | ........................... | 294/87.1 |
| 2003/0140475 A1 * | 7/2003 | Wah et al. | .................... | 29/401.1 |
| 2006/0187647 A1 * | 8/2006 | Iy et al. | ........................ | 361/719 |

* cited by examiner

Primary Examiner — Dean Kramer
Assistant Examiner — Stephen Vu
(74) Attorney, Agent, or Firm — Jefferson IP Law, LLP

(57) ABSTRACT

A pick-and-place module for test handlers is disclosed that includes a main body and a kit. The main body forms vacuum paths therein and the kit also forms vacuum passages therein. The kit is detachably mounted to the main body in a hook coupling manner. The pick-and-place module can be applied to all customer trays having different loading capabilities when only the kit of the pick-and-place module needs to be replaced, so there is no need to manufacture the entire pick-and-place module and this reduces manufacturing costs. The pick-and-place module can reduce the amount of resources to be replaced and reduce the replacement time since the kit can be easily removed from the main body of the pick-and-place module in a hook manner.

5 Claims, 10 Drawing Sheets (a)

(b)

(c)

(a)

(b)

(c)

PICK-AND-PLACE MODULE FOR TEST HANDLER

PRIORITY

This application claims the benefit under 35 U.S.C. §119 (a) of a Korean patent application filed on Jun. 11, 2009 in the Korean Intellectual Property Office and assigned Serial No. 10-2009-0051943 and a Korean patent application filed on Mar. 26, 2010 in the Korean Intellectual Property Office and assigned Serial No. 10-2010-0027576, the entire disclosures of both of which are hereby incorporated by reference.

BACKGROUND OF THE INVENTION

1. Field of the Invention

The present invention relates to test handlers. More particularly, the present invention relates to a pick-and-place module included in a pick-and-place apparatus for test handlers that picks and places semiconductor devices between different loading and aligning elements to transfer them therebetween.

2. Description of the Related Art

A test handler is equipment that loads semiconductor devices in customer trays, which are manufactured by a certain process, onto a test tray, supports a tester to test the semiconductor devices loaded on the test tray, sorts the semiconductor devices based on the test result, and then unloads the semiconductor devices in the test tray onto customer trays.

The test handler includes a pick-and-place apparatus that transfers semiconductor devices between different loading or aligning elements, such as customer trays, test trays, aligners, buffers and sorting tables. The pick-and-place apparatus has at least one pick-and-place module.

The pick-and-place module includes a plurality of pickers, arranged in a line, for sucking-picking semiconductor devices or placing them using vacuum pressure.

The customer tray serves to load and store semiconductor devices, so it is preferable that the customer tray is designed to load as large a number of semiconductor devices as possible. With developments in semiconductor manufacturing process technology, the semiconductor devices can now be manufactured in smaller sizes however they have the same function, so that more semiconductor devices can be loaded onto the same customer tray. That is, if a customer tray has been loading eight semiconductor devices onto its single row, as semiconductor devices are reduced in size due to the development of semiconductor manufacturing process technology, ten or twelve semiconductor devices can now be loaded onto the same customer tray in a single row. In that case, the interval between the semiconductor devices, loaded onto the customer tray in lots of ten or twelve per row, is narrower than the interval between the semiconductor devices loaded onto the same customer tray in lots of eight per row.

If a test handler is supplied with customer trays on which eight semiconductor devices are loaded in a single row and then with customer trays on which ten or twelve semiconductor devices are loaded in a single row, or vice-versa, the pickers of the pick-and-place module need to adjust the interval corresponding thereto. However, there is no means for adjusting the intervals between the pickers so that the pickers can be universally applied to all customer trays on which different numbers of semiconductor devices are loaded in the same area. Therefore, when the customer trays having different loading capacities are supplied to the test handler, the pick-and-place modules need to be replaced.

In addition, the time required to transfer semiconductor devices can be reduced only when one pick-and-place module is provided with a plurality of pickers corresponding to the number required to pick all the semiconductor devices loaded on a customer tray in a single row. If a customer tray, on which eight semiconductor devices are loaded in a single row, is replaced with a customer tray on which ten or twelve semiconductor devices are loaded in a single row, or vice-versa, the number of pickers needs to be increased or decreased. However, conventional pick-and-place modules do not have any means to increase or decrease the number of pickers, so they must be replaced whenever the number of semiconductor devices is changed on the customer tray to be supplied to the test handler.

Therefore, conventional pick-and-place modules are disadvantageous in that they need to be manufactured in various types according to the intervals between pickers or the numbers of pickers. In addition, since conventional pick-and-place modules must be completely replaced, manufacturing costs increases, resources are wasted, and replacement time is required.

SUMMARY OF THE INVENTION

An aspect of the present invention is to address the above-mentioned problems and/or disadvantages and to provide at least the advantages described below. Accordingly, an aspect of the present invention is to provide a technology that can allow only part of a pick-and-place module to be replaced, thereby achieving applicability to all customer trays having different loading capacities, in a simple manner.

In accordance with an aspect of the present invention, a pick-and-place module for test handlers is provided. The module includes a main body forming N vacuum paths therein, wherein N is a positive integer, and a kit forming M vacuum passages therein and having M pickers, where $1 \leq M \leq$ and the M vacuum passages corresponds to the entire or part of the N vacuum paths. The kit is detachably mounted to the main body in a hook coupling manner. The M pickers are communicated with the M vacuum passages, respectively, and pick and place semiconductor devices using vacuum pressure of the M vacuum passages.

In an exemplary implementation, the kit includes a first latch pin at one end and a second latch pin at its other end. The main body includes a first locking member at one end, hooked to the first latch pin, and a second locking member at the other end, hooked to the second latch pin. The second locking member is pivoted to be removed from the second latch pin.

In an exemplary implementation, the second locking member is pivotally installed to a pivot and includes a lever part and a hook part, which are distinguished with respect to the pivot. The lever part is elastically supports so that the hook part can be hooked to the second latch pin.

In an exemplary implementation, the kit forms a first installation groove, to which the first latch pin is installed, at a portion close to one end thereof, and a second installation groove, to which the second latch pin is installed, at a portion close to the other end thereof.

In an exemplary implementation, at least one of the first and second latch pins is shaped as the letter 'L' and one end of the latch pin is fixed to the kit by a coupling member.

In an exemplary implementation, the pick-and-place module may further include a pivot prevention member for preventing an unintentional pivoting of the second locking member.

Other aspects, advantages, and salient features of the invention will become apparent to those skilled in the art from the following detailed description, which, taken in conjunction with the annexed drawings, discloses exemplary embodiments of the invention.

BRIEF DESCRIPTION OF THE DRAWINGS

The above and other aspects, features, and advantages of certain exemplary embodiments of the present invention will be more apparent from the following description taken in conjunction with the accompanying drawings, in which.

Throughout the drawings, it should be noted that like reference numbers are used to depict the same or similar elements, features, and structures.

BRIEF DESCRIPTION OF SYMBOLS IN THE DRAWINGS

Figure 1:
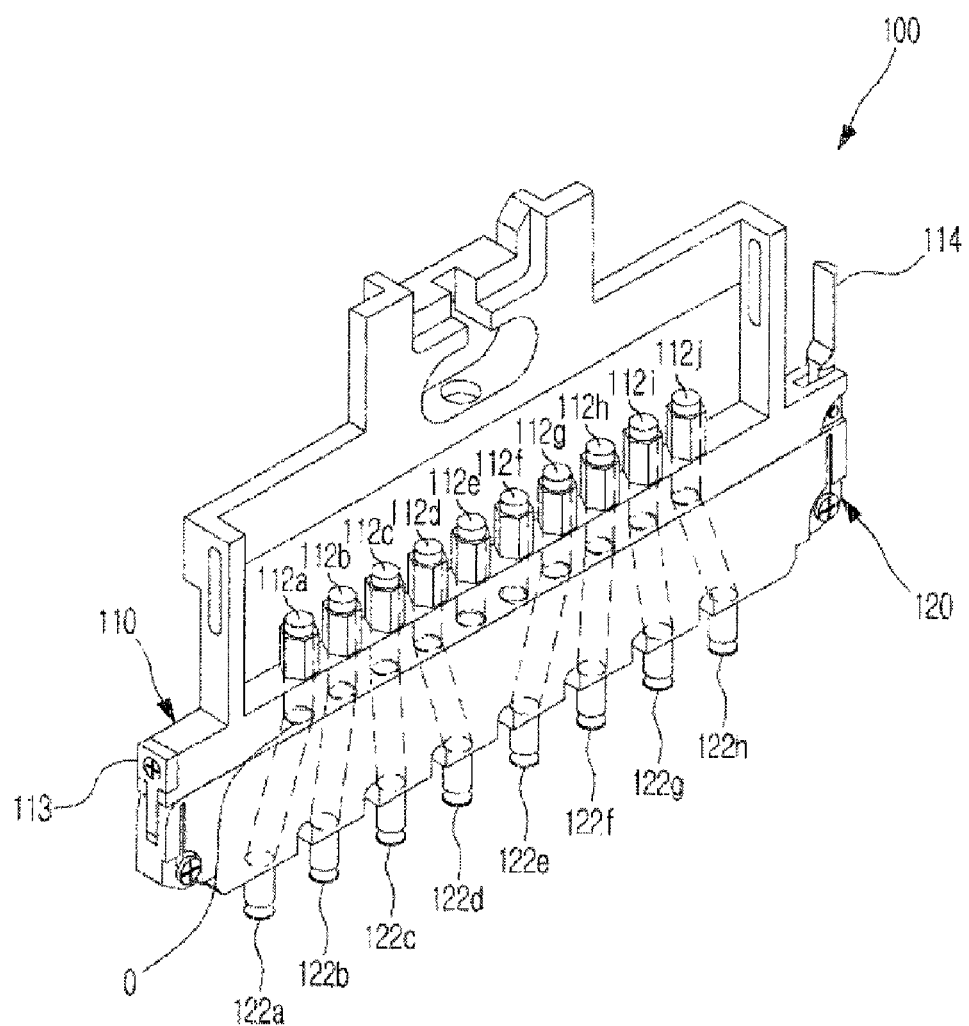
FIG. 1 is an assembled perspective view illustrating a pick-and-place module according to an exemplary embodiment of the present invention.

100: pick-and-place module
110: main body
111a~111j: vacuum paths
112a~112j: connection blocks
113: first locking member
114: second locking member
114a: hook part
114b: lever part
115: reference protrusion
116: installation groove
117: pivot
118: elastic member
120: kit
121a~121h: vacuum passages
122~122h: picker
123: first latch pin
124: second latch pin
125: first installation groove
126: second installation groove
827: pivot prevention member Detailed Description of Exemplary Embodiments The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. In addition, descriptions of well-known functions and constructions incorporated are omitted for clarity and conciseness.

The terms and words used in the following description and claims are not limited to the bibliographical meanings, but, are merely used by the inventor to enable a clear and consistent understanding of the invention. Accordingly, it should be apparent to those skilled in the art that the following description of exemplary embodiments of the present invention are provided for illustration purpose only and not for the purpose of limiting the invention as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 2:
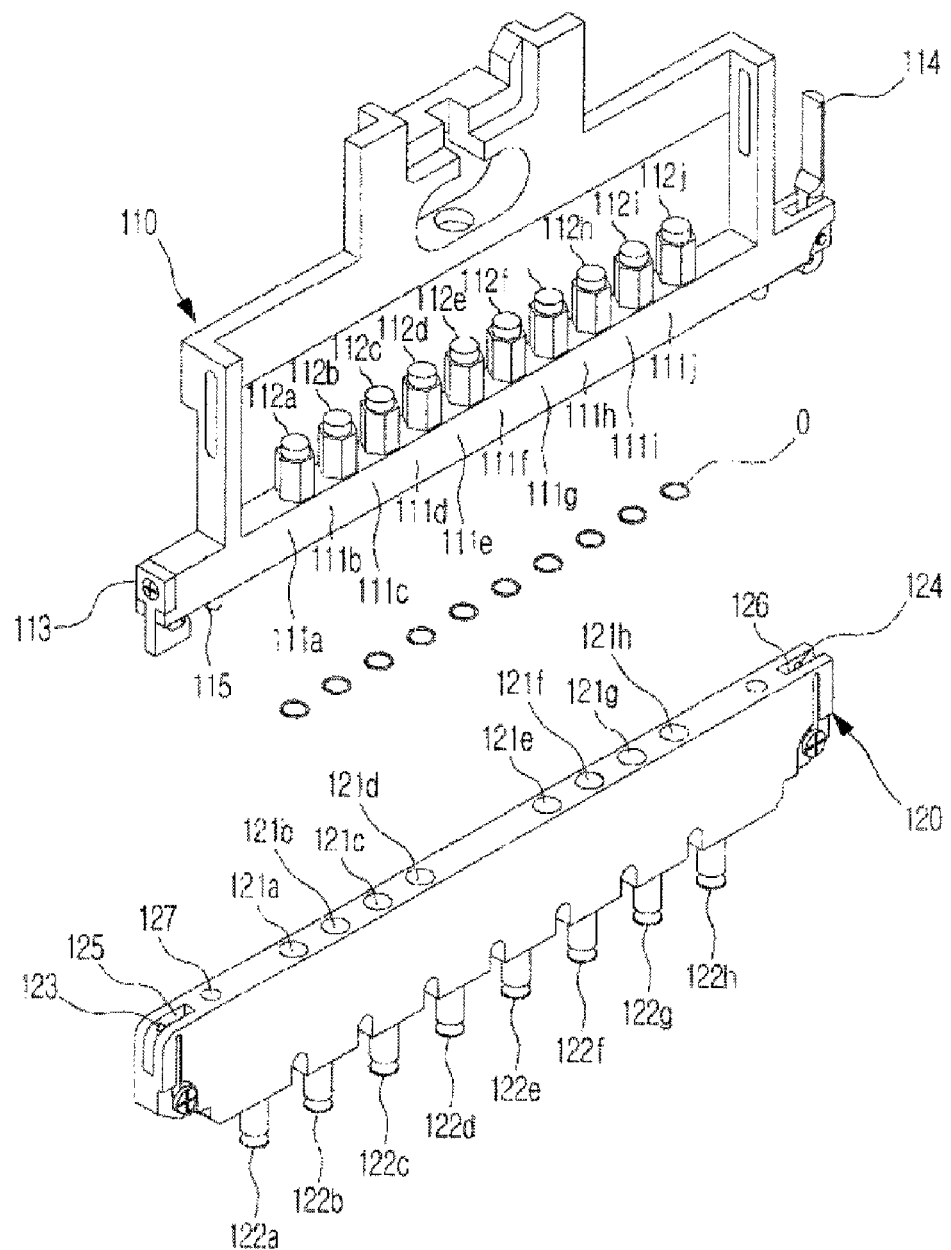
FIG. 2 is an exploded perspective view illustrating the pick-and-place module according to an exemplary embodiment of the present invention.
Figure 3:
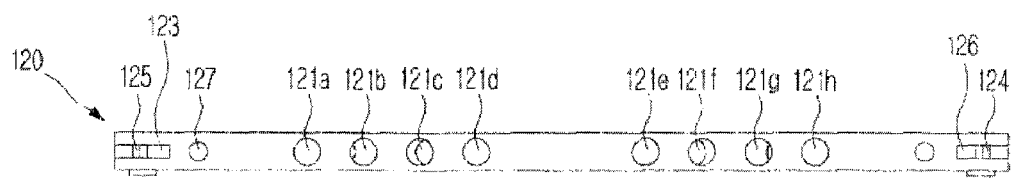
FIG. 3 is a plan view illustrating a kit of the pick-and-place module according to an exemplary embodiment of the present invention.

FIG. 1 is an assembled perspective view illustrating a pick-and-place module according to an exemplary embodiment of the present invention. FIG. 2 is an exploded perspective view illustrating the pick-and-place module according to an exemplary embodiment of the present invention. FIG. 3 is a plan view illustrating a kit of the pick-and-place module according to an exemplary embodiment of the present invention.

Referring to FIGS. 1 to 3, the pick-and-place module 100 includes a main body 110, mounted to an X-Y robot (not shown), and a kit 120 detachably mounted to the main body 110.

The main body 110 is provided with 10 vacuum paths 111a to 111j that are communicated with vacuum lines (not shown), via connection blocks 112a to 112j, respectively. The vacuum lines are shaped as tubes and extended from an apparatus for generating a vacuum pressure (not shown).

The kit 120 is provided with eight vacuum passages 121a to 121h vertically formed therein, corresponding to eight of the 10 vacuum paths 111a to 111j, i.e., 111a to 111d and 111g and 111j. The kit 120 is also provided with 8 pickers 122a to 122h that are communicated with the eight vacuum passages 111a to 111d and 111g and 111j to pick up or put down semiconductor devices using vacuum pressure that is formed via a vacuum pressure transfer path, i.e., the vacuum line-connection block-vacuum path-vacuum passage. The two remaining vacuum passages 111e and 111f are closed by the upper surface of the kit 120 when the kit 120 is mounted to the main body 110.

The main body 110 allows O-rings to be placed on the lower surface thereof, corresponding to the positions of the vacuum passages 111a to 111j, so that the O-rings can prevent air from leaking between the vacuum paths 111a to 111j and the vacuum passages 121a to 121h, respectively.

The kit 120 is detachably mounted to the main body 110 in a hook coupling method. To this end, the kit 120 includes first and second latch pins 123 and 124 at its opposite ends. That is, the first latch pin 123 is installed inside a first installation groove 125 formed at one end of the kit 120. Likewise, the second latch pin 124 is installed inside a second installation groove 126 formed at one end of the kit 120.

The main body 110 forms first and second locking members 113 and 114 for hooking the first and second latch pins 123 and 124, respectively, at both opposite ends thereof.

The first locking member 113 is implemented with a hook shape to enhance the coupling force with the first latch pin 123.

The main body 110 forms reference protrusions 115 protruded outward on the lower surface thereof at both opposite side portions close to the both ends. Likewise, the kit 120 forms reference grooves 127 on the upper surface thereof at both opposite side portions, corresponding to the reference protrusions 115 of the main body 110. Using the reference protrusions 1115 and the reference grooves 127, the main body 110 and the kit 120 can be correctly assembled.

Figure 4:
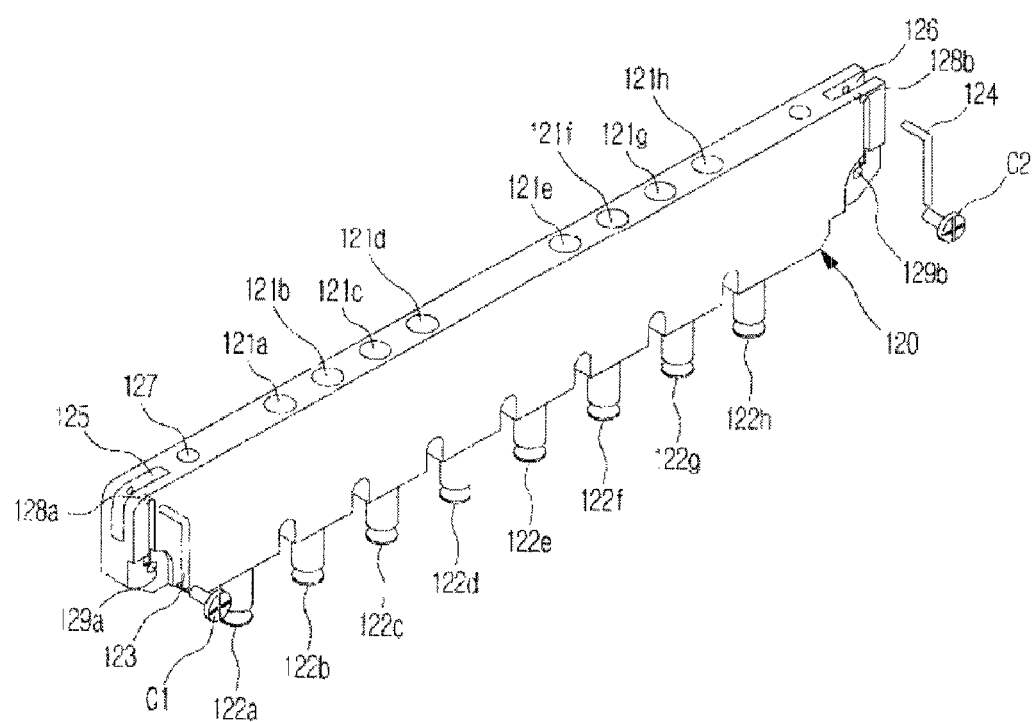
FIG. 4 is an exploded perspective view illustrating the kit of the pick-and-place module according to an exemplary embodiment of the present invention.

FIG. 4 is an exploded perspective view illustrating the kit of the pick-and-place module according to an exemplary embodiment of the present invention.

Referring to FIG. 4, the first and second latch pins 123 and 124 are shaped as the character 'L'. One end of each of the first and second latch pins 123 and 124 is correspondingly inserted into the installation grooves 128a and 128b of the kit 120.

The other ends of the first and second latch pins 123 and 124 are fixed to the kit 120 by coupling members C1 and C2, for example, bolts, screws, or the like.

The second locking member 114 pivots so that it can release its lock from the second latch pin 124, which will be explained in detail with reference to FIG. 5.

Figure 5:
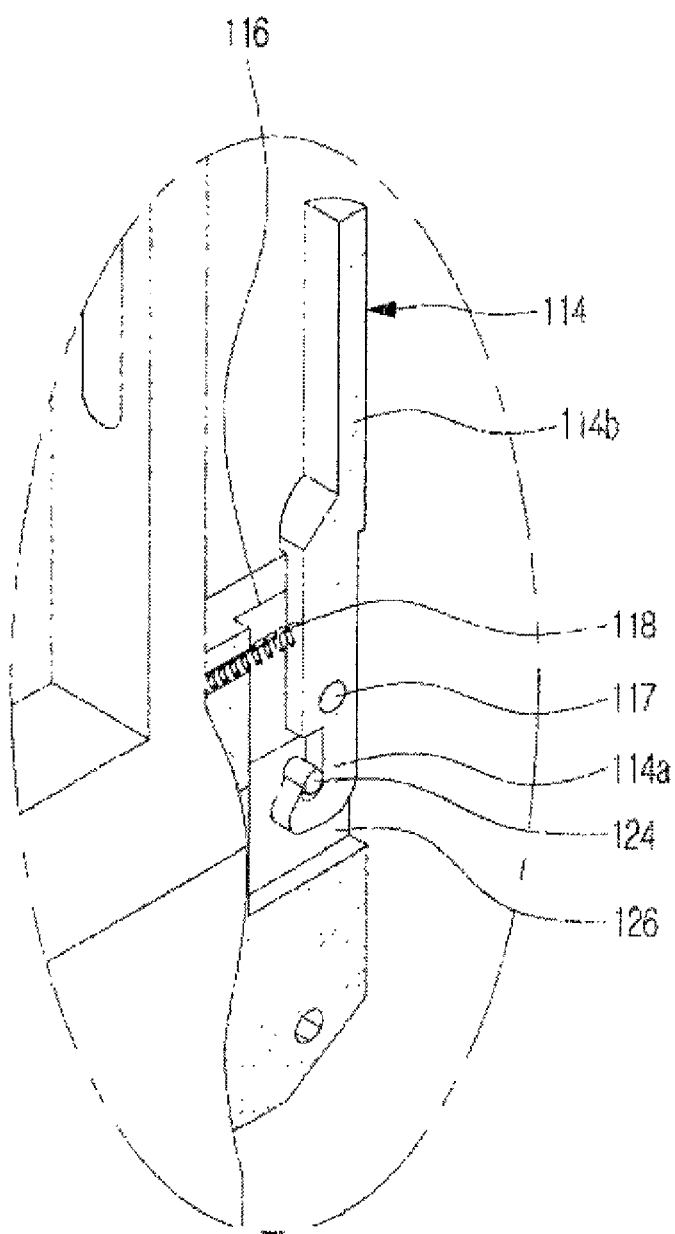
FIG. 5 is an enlarged view illustrating part of the pick-and-place module according to an exemplary embodiment of the present invention.

FIG. 5 is an enlarged view illustrating part of the pick-and-place module according to an exemplary embodiment of the present invention.

Referring to FIG. 5, the second locking member 114 is pivotally installed to the pivot 117 affixed to the inside of the installation groove 116 of the other end of the main body 110. The second locking member 114 is distinguished between a hook part 114a and a lever part 114, with respect to the pivot 117.

The hook part 114a is hooked to the second latch pin 124 and can be easily pivoted with respect to the pivot 117 when the user operates the lever part 114b.

An elastic member 118 is installed to the inside of the installation groove 116. The elastic member 118 elastically supports the lever part 114b so that the hook part 114a can be hooked to the second latch pin 124.

When the user applies force to the lever part 114b, the elastic member 118 is compressed and then the hook part 114a releases the coupling with the second latch pin 124. If the user releases the force from the lever part 114b, the hook part 114a is placed at the original position by the restoring force of the elastic member 118.

Figure 6:
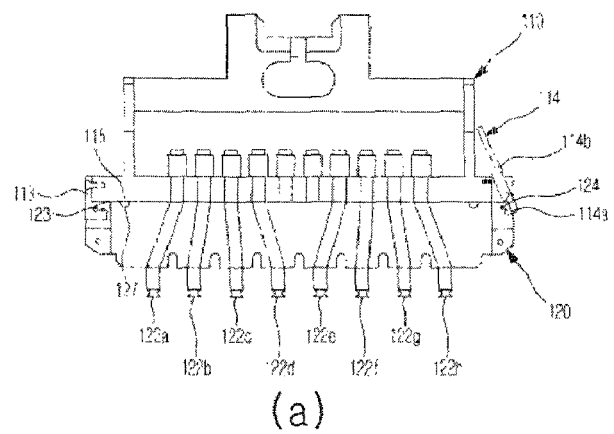
FIGS. 6A to 6C are side views that describe a method for replacing a kit of the pick-and-place module according to an exemplary embodiment of the present invention.
Figure 6:
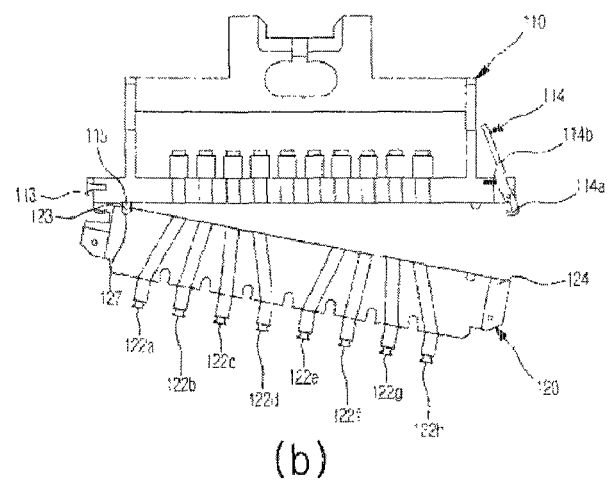
Figure 6:
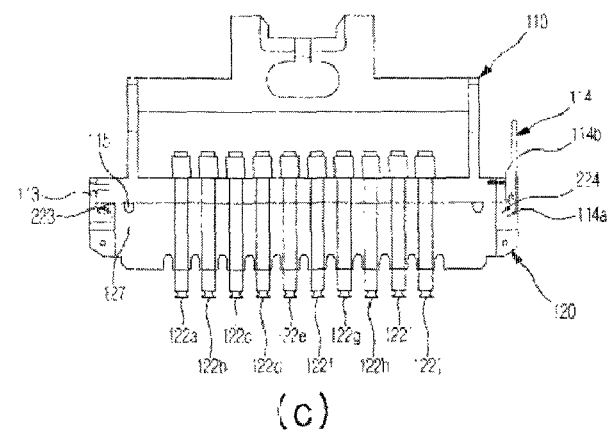

The following description is provided regarding a method for replacing the kit of the pick-and-place module with reference to FIGS. 6A to 6C.

FIGS. 6A to 6C are side views that describe a method for replacing a kit of the pick-and-place module according to an exemplary embodiment of the present invention.

Referring to FIG. 6A, in a state where the kit 120 equipped with 8 pickers 122a to 122h is mounted to the main body 110, when force is applied to the lever part 114b of the second locking member 114 in the main body 110, the hook part 114a of the second locking member 114 is removed from the second latch pin 124.

Referring to FIG. 6B, the other end of the kit 120, i.e., the portion where the second latch pin 124 is installed, is first separated from the main body 110 and then the first locking member 113 of the main body 110 is removed from the first latch pin 123 of the kit 120, thereby separating the kit 120 from the main body 110.

As such, since the kit 120 is separated from the main body 110, pivoting at a certain angle with respect to the first latch pin 123, it can avoid interfering with the reference protrusion 115 on the lower surface of the main body 110 during the process of separation.

In an exemplary implementation, the upper end of the kit, close to the portion where the first latch pin 123 is installed, may be rounded, thereby avoiding the interference of the main body 110 when the kit 120 is removed from the main body 110.

Referring to FIG. 6C, in order to mount the kit 120 with 10 pickers 122a to 122j to the main body 110, the first locking member 113 is hooked to the first latch pin 123 of the kit 120 while force is being applied to the lever part 114b of the second locking member 114. After that, when the force applied to the lever part 114b is released, the second locking member 114 is hooked to the second latch pin 124 by the restoring force of the elastic force of the elastic member 118.

In accordance with an exemplary embodiment of the present invention, although the kit 120 is equipped with 10 pickers 122a to 122j, it should be understood that the present invention is not limited to the embodiment. For example, the kit can be implemented to include pickers equal to or less than the number of the vacuum paths of the main body.

Figure 7:
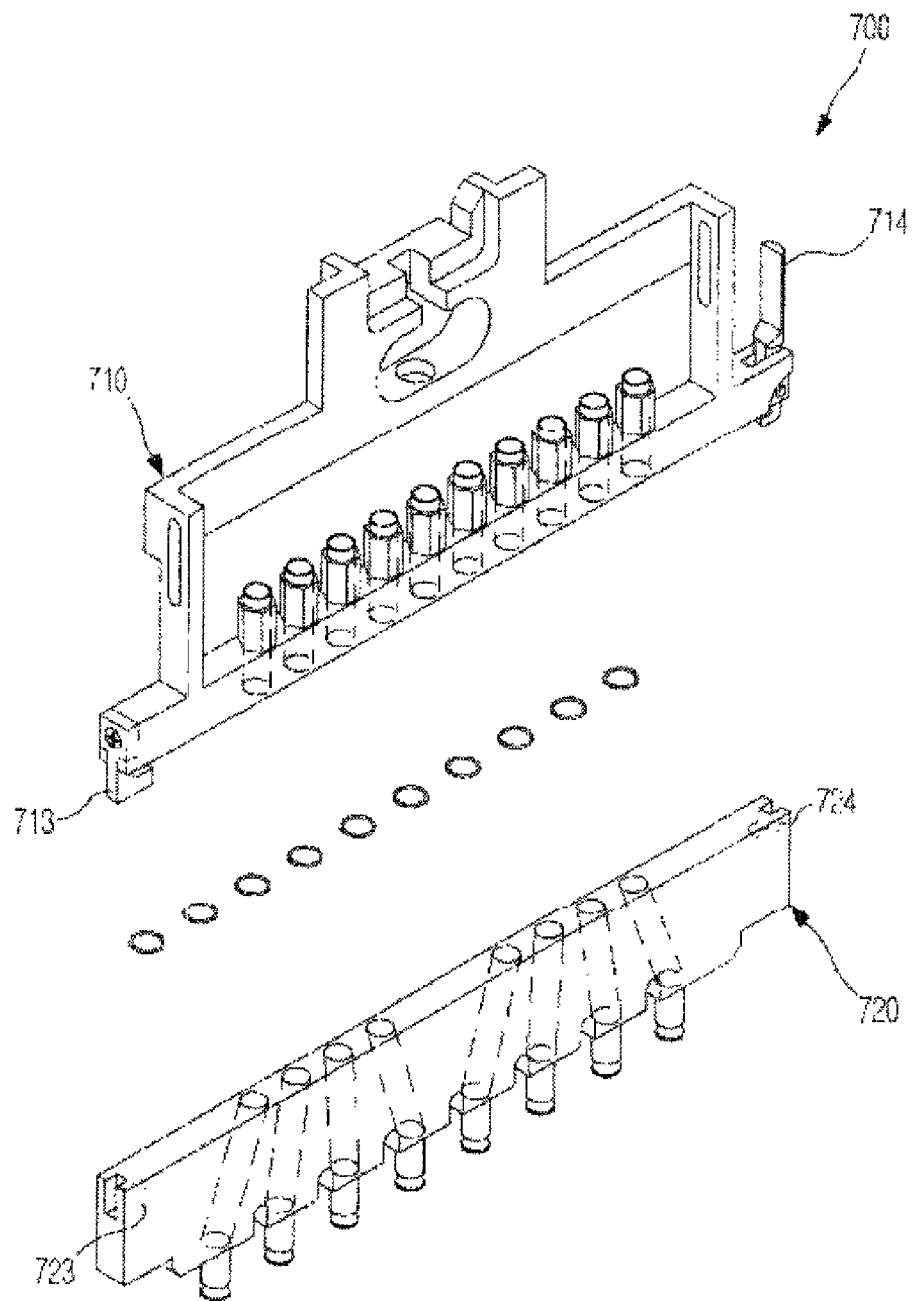
FIG. 7 is an exploded perspective view illustrating a pick-and-place module according to an exemplary embodiment of the present invention.

FIG. 7 is an exploded perspective view illustrating a pick-and-place module according to an exemplary embodiment of the present invention.

Referring to FIG. 7, the pick-and-place module according to a second embodiment of the present invention can be configured in such a way that the kit 720 forms first and second latching grooves 723 and 724 at both opposite ends, compared to the first and second latch pins 123 and 134 of the first embodiment shown in FIGS. 1 to 5, That is, the first locking member 713, installed to the one end of the main body 710, is hooked to the first latching groove 723. The second locking member 714, pivotally installed to the other end of the main body 710, is hooked to the second latching groove 723.

Figure 8A:
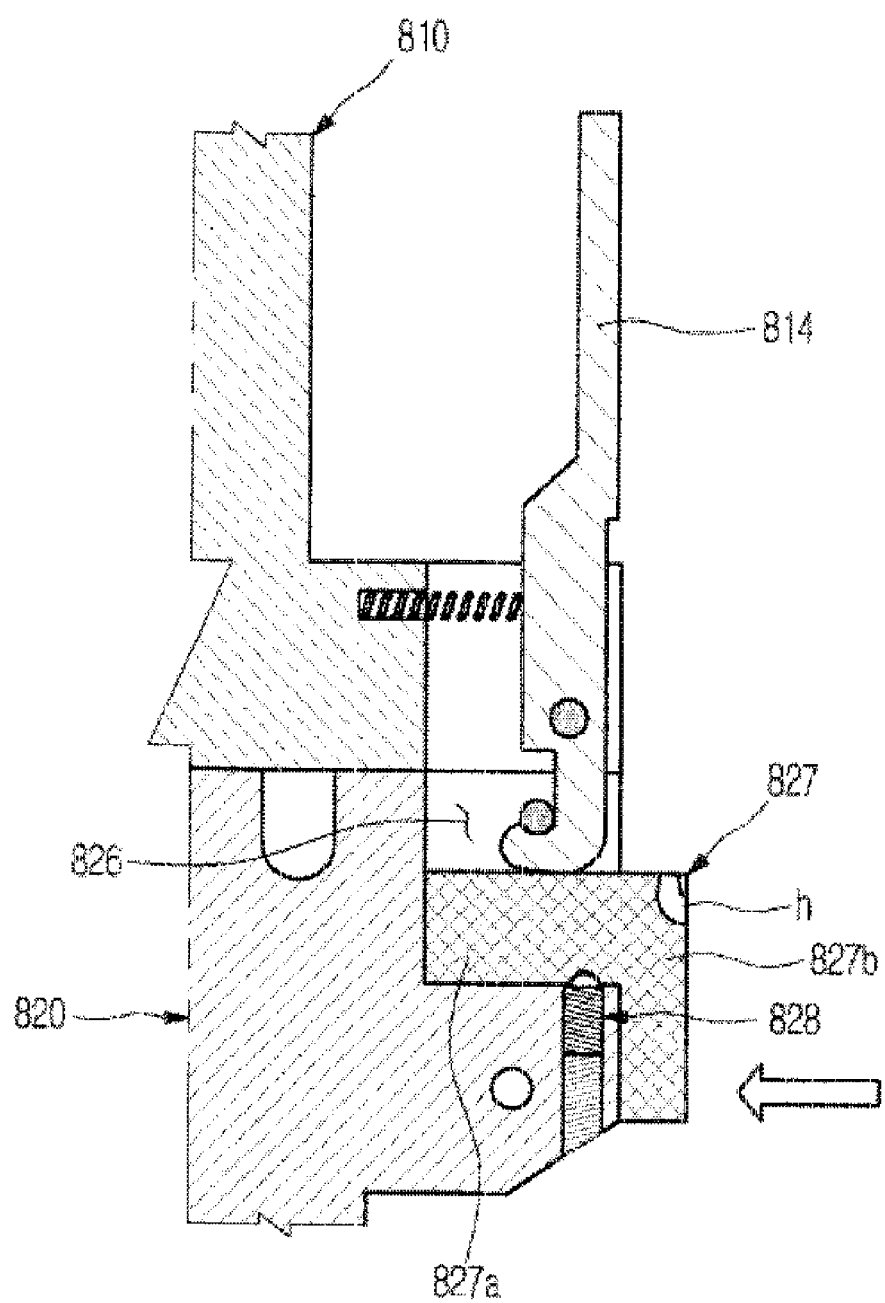
FIGS. 8A and 8B are cross-sectional views illustrating a primary part of a pick-and-place module according to an exemplary embodiment of the present invention.
Figure 8B:
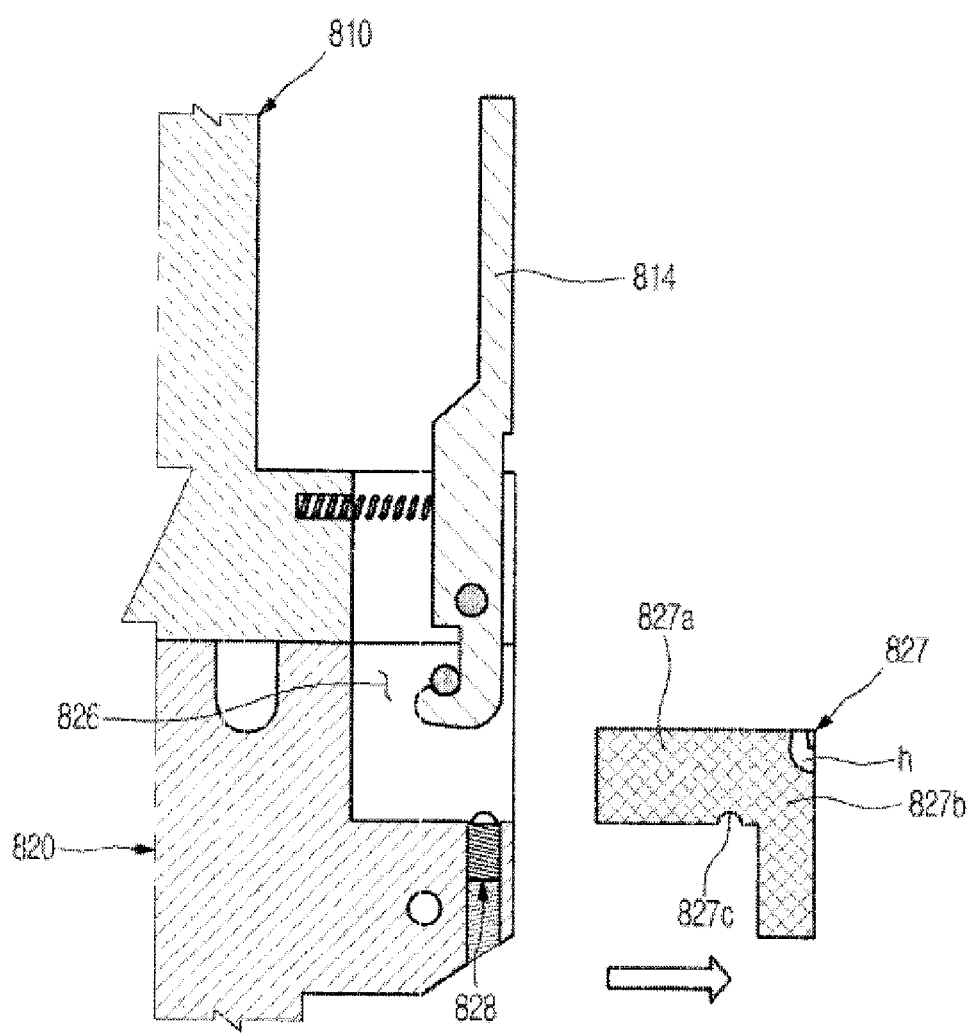

FIGS. 8A and 8B are cross-sectional views illustrating a primary part of a pick-and-place module according to an exemplary embodiment of the present invention.

In general, a metal member may be worn during frequent use over a long period of time. As such, if the pick-and-place module 100 of FIG. 1 is worn, the second locking member 114 is unintentionally pivoted, so the kit 120 may be removed from the main body 110. An unintentional pivoting motion may also occur by the vibration generated when the test handler is operated in a state where the second locking member 114 is incompletely hooked to the second latch pin 124 by a worker's error. In addition, an unintentional pivoting motion occurs when a worker unintentionally touches the second locking member 114, whilst performing other jobs.

Referring to FIGS. 8A and 8B, the pick-and-place module is equipped with a pivot prevention member 827 to prevent the unintentional pivoting of the second locking member 814.

Figure 9:
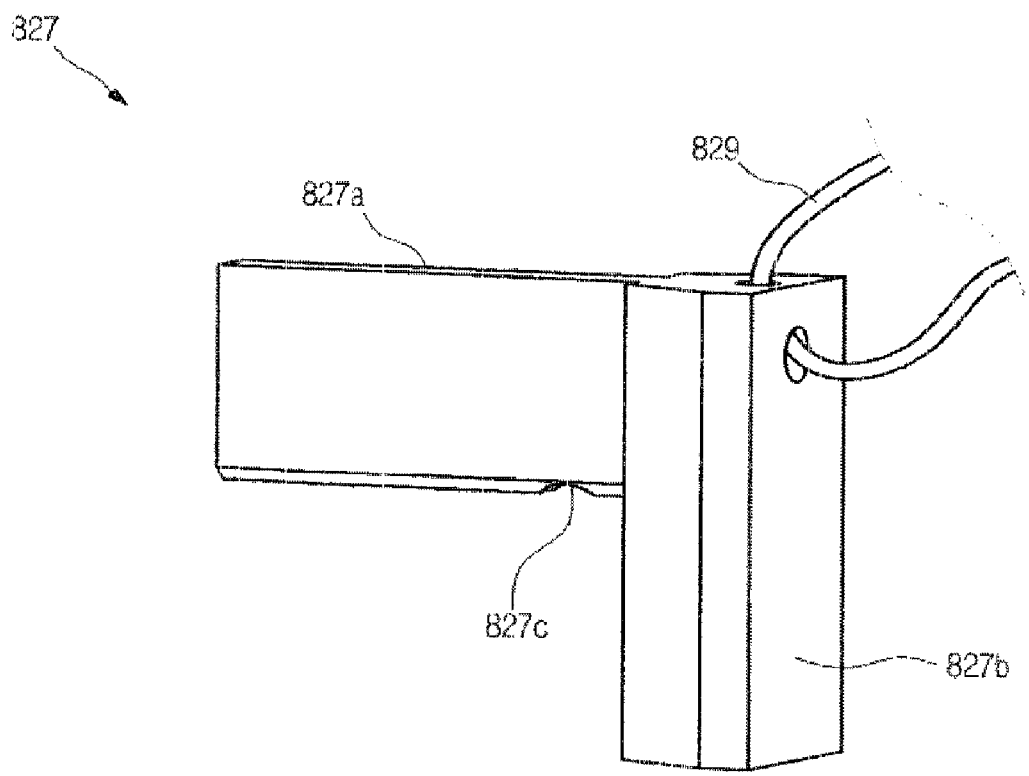
FIG. 9 is a perspective view illustrating the pivot prevention member of the pick-and-place module according to an exemplary embodiment of the present invention shown in FIG. 8B.

FIG. 9 is a perspective view illustrating the pivot prevention member of the pick-and-place module according to an exemplary embodiment of the present invention shown in FIG. 8B.

Referring to FIG. 9, the pivot prevention member 827 is shaped as the letter 'L' and includes an inserting part 827a and a holding part 827b.

As shown in FIG. 8A, when the inserting part 827a is inserted into the second installation groove 826 of the kit 820, its upper side contacts the lower surface of the lower end of the second locking member 814, thereby preventing the unintentional pivoting of the second locking member 814. The inserting part 827a forms a ball receiving groove 827 on the lower surface to receiving a ball. To this end, the second installation groove 826 of the kit 820 is formed downwardly longer than the second installation groove 126 shown in FIG. 1. The kit 820 also includes a ball plunger 828 installed in the second installation groove 826 at a position corresponding to the ball receiving groove 827.

The holding part 827b is held by a user and is formed as a rod that is relatively long and perpendicular to the inserting part 827a.

As shown in FIG. 8A, when the user forwardly rotates the second locking member 814 to be coupled with the kit 820 and then inserts the inserting part 827a of the pivot prevention member 827 into the lower portion of the second locking member 814, the kit 820 is coupled to the main body 810. As shown in FIG. 8B, if the pivot prevention member 827 is pulled out and then the second locking member 814 is reversely rotated, the kit 820 is separated from the main body 810.

Referring back to FIG. 9, it is preferable that the pivot prevention member 827 forms a hanging hole h. This hanging hole h allows a string 829 to pass therethrough to attach the pivot prevention member 827 to the main body 810, thereby avoiding the loss of the pivot prevention member 827. If a plurality of pick-and-place modules are equipped with the pick-and-place apparatus, one string 829 may connect four pivot prevention members to the main body.

As described above, the pick-and-place module according to the present invention can be applied to all customer trays having different loading capabilities when only the kit of the pick-and-place module needs to be replaced, so there is no need to manufacture the entire pick-and-place module and this reduces manufacturing costs.

The pick-and-place module according to the present invention can reduce the amount of resources to be replaced and reduce the replacement time since the kit can be easily removed from the main body of the pick-and-place module in a hook manner.

In addition, the pick-and-place module is structured in such a way that the kit is correctly coupled to the main body as the reference protrusion on the lower surface of the main body is inserted into the reference groove on the upper surface of the kit and also removed from the main body while pivoting at a certain degree with respect to the first latch pin, thereby preventing interference between the kit and the reference protrusion when the kit is separated from the main body.

While the invention has been shown and described with reference to certain exemplary embodiments thereof, it will be understood by those skilled in the art that various changes in form and details may be made therein without departing from the spirit and scope of the invention as defined in the appended claims and their equivalents.

What is claimed is:

1. A pick-and-place module for test handlers, the module comprising:
 a main body forming N vacuum paths therein, wherein N is a positive integer; and
 a kit forming M vacuum passages therein and having M pickers, where 1<M <N and the M vacuum passages corresponds to part of the N vacuum paths,
wherein:
the kit is detachably mounted to the main body in a hook coupling manner; and
the M pickers are communicated with the M vacuum passages, respectively, and pick and place semiconductor devices using vacuum pressure of the M vacuum passages,
wherein the kit comprises a first latch pin at one end and a second latch pin at another end,
wherein the main body comprises a first locking member at one end, hooked to the first latch pin, and a second locking member at another end, hooked to the second latch pin,
wherein the second locking member is pivoted to be removed from the second latch pin, and
wherein the kit forms a first installation groove, to which the first latch pin is installed, at a portion close to one end thereof, and a second installation groove, to which the second latch pin is installed, at a portion close to another end thereof.

2. The module according to claim 1, wherein:
the second locking member is pivotally installed to a pivot and includes a lever part and a hook part, which are distinguished with respect to the pivot; and
the lever part is elastically supports so that the hook part can be hooked to the second latch pin.

3. The module according to claim 1, wherein at least one of the first and second latch pins is shaped as the letter 'L' and one end of the latch pin is fixed to the kit by a coupling member.

4. The module according to claim 1, further comprising:
a pivot prevention member for preventing an unintentional pivoting of the second locking member.

5. A test handler having the pick-and-place module as set forth in claim 1.

* * * * *